United States Patent

[11] 3,628,185

[72] Inventors William Joshua Evans
Berkeley Heights;
Ralph Lawrence Johnston, South Plainfield; Donald Lee Scharfetter, Morristown; Thomas Edward Seidel, Berkeley Heights, all of N.J.

[21] Appl. No. 23,850
[22] Filed Mar. 30, 1970
[45] Patented Dec. 14, 1971
[73] Assignee Bell Telephone Laboratories, Incorporated Murray Hill, N.J.

[54] SOLID-STATE HIGH-FREQUENCY SOURCE
11 Claims, 7 Drawing Figs.

[52] U.S. Cl. 331/107 R, 317/235 T, 317/235 AM, 331/96, 331/101
[50] Field of Search 317/235 T, 235 AM, 235; 331/107

[56] References Cited

UNITED STATES PATENTS

| | | | |
|---|---|---|---|
| 3,236,698 | 2/1966 | Shockley | 317/235 |
| 3,284,639 | 11/1966 | Giuliano et al. | 317/235 |
| 3,121,808 | 2/1964 | Kahng et al. | 317/235 |
| 3,460,055 | 8/1969 | Josenhans et al. | 331/107 |
| 3,534,293 | 10/1970 | Harkless | 331/107 |

OTHER REFERENCES

Electronics Letters, R. A. Giblin, " High-Efficiency Operation of Avalanche-Diode Oscillators," Feb. 9, 1968, Vol. 4, No. 3, pp. 52- 54, 331- 107.

*Primary Examiner*—John Kominski
*Attorneys*—R. J. Guenther and Arthur J. Torsiglieri

ABSTRACT: A P+PNN+ semiconductive diode is used as the active element in a solid-state microwave source in either an IMPATT, TRAPATT or combination mode of operation. Ion implantation is used in the fabrication of the diode to achieve close control of the doping profile required to realize the electric field distribution important for efficient operation.

Patented Dec. 14, 1971 3,628,185

2 Sheets-Sheet 1

INVENTORS: W. J. EVANS
R. L. JOHNSTON
D. L. SCHARFETTER
T. E. SEIDEL

BY Arthur J. Torsiglieri
ATTORNEY

SOLID-STATE HIGH-FREQUENCY SOURCE

This invention relates to microwave oscillators utilizing a solid-state semiconductive device as the active element.

BACKGROUND OF THE INVENTION

Among the most promising solid-state microwave oscillators in the prior art are the IMPATT types (*Imp*act Ionization *A*valanche *T*ransit *T*ime). It is characteristic of such an oscillator that it employs as the active element a semiconductive diode which includes an avalanche region and a drift region intermediate between cathode and anode terminal portions and that a dynamic negative resistance is achieved by introducing an appropriate transit time to avalanching carriers in their travel across the drift region.

Two forms of diodes have proven useful as the active elements in microwave oscillators of this kind. One employs a PNIN (or NPIP) structure as described in U.S. Pat. No. 2,899,646, issued Aug. 11, 1959, to W. T. Read, Jr., the other a P+PN+ (or N+NP+) structure as described in U.S. Pat. No. 3,270,293, issued Aug. 30, 1966, to B. C. DeLoach, Jr. and R. L. Johnston.

In an effort to provide microwave sources of greater output power, various suggestions have been made for increasing the efficiency of such oscillators. Specifically, in U.S. Pat. No. 3,356,866, issued Dec. 5, 1967, to T. Misawa, it is suggested that there be employed a diode which has a PIPININ resistivity profile. Such a diode employs an avalanche region and a pair of drift regions and is designed to use both types of charge carriers in providing the negative resistance effect. Specifically, by making the transit times of the two types of carriers through the two separate drift regions substantially equal, each type of carrier contributes to the negative resistance effect whereby the overall efficiency is enhanced. It can be appreciated that to satisfy this last relationship accurate control of the various layers is important.

In practice, it has proved difficult to achieve this control reliably in structures to be used at very high frequencies where the various zones must be very thin to achieve the appropriately short transit times. In particular, at the frequencies where these devices are especially attractive, drift regions of about 1 micron or less are needed.

We have found that the desired increase in efficiency by virtue of using both carriers can also be achieved in a simpler structure and we have devised a technique for fabricating the simplified structure reliably. Specifically we have found it feasible to achieve the desired results in a simple structure which includes one centrally located avalanche region which serves both drift regions.

SUMMARY OF THE INVENTION

In particular we have found that a P+PNN+ diode of appropriate parameters can be used as the active element and that a wafer of appropriate parameters can be readily fabricated by use of ion-implantation techniques. A diode of this kind includes two drift regions which share a single high-field centrally located avalanche region in a structure which is easy to fabricate. Moreover, we have discovered further that a diode of this kind is particularly well adapted for operation of an avalanche diode in the mode now often described at the TRAPATT (*Tra*pped *P*lasma *A*valanche *T*riggered *T*ransit) mode which is a high-efficiency mode of an IMPATT oscillator involving the provision in the associated circuitry of an additional resonance at at least one subharmonic of the IMPATT frequency and abstraction of output power at such subharmonic. Moreover, we have found further that optimum operation in the TRAPATT mode is achieved with a P+PNN+ diode which is designed to be asymmetric so that one drift section operates in the IMPATT mode and the other drift section in the TRAPATT mode concurrently.

BRIEF DESCRIPTION OF THE DRAWING

The invention will be discussed more fully in conjunction with the accompanying drawings in which.

DETAILED DESCRIPTION

Figures 1, 2, 3:
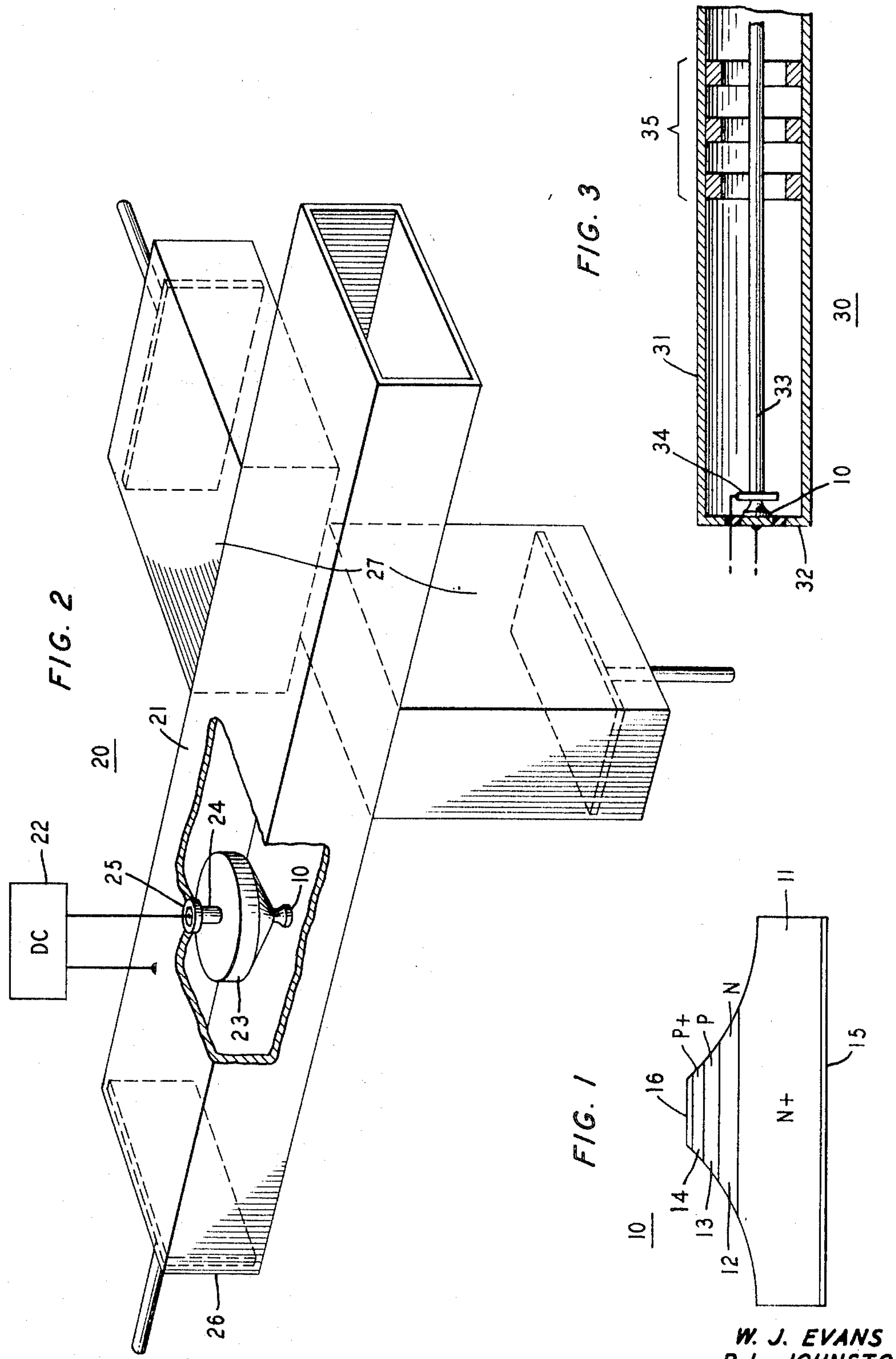
FIG. 1 shows a P+PNN+ diode of the kind useful in the invention although not drawn to scale.
FIG. 2 shows a microwave source which includes a diode of the kind shown in FIG. 1 and is adapted for use in the IMPATT mode.
FIG. 3 shows a microwave source which includes a diode of the kind shown in FIG. 1 and is adapted for operation either in a pure TRAPATT mode or with one section of the diode operating in the TRAPATT mode and the other section in the IMPATT mode.

With reference now to the drawing, the semiconductive element in FIG. 1 comprises a monocrystalline silicon wafer 10 which comprises in succession relatively heavily doped *n*-type terminal region 11, relatively lightly doped *n*-type intermediate region 12, relatively lightly doped *p*-type intermediate region 13, and relatively heavily doped *p*-type terminal region 14. In accordance with usual practice, such a wafer is described herein as having an N+NPP+ resistivity distribution where (+) is used to denote relatively low resistivity. The exposed broad surfaces of terminal regions 11 and 14 are provided with low-resistance connections 15, 16 each of which may simply be a plated film of a metal, such as gold, to facilitate connection thereto.

Typically the regions designated (+) will have a doping level at least two orders of magnitude greater than regions not so designated.

Typically such an element is fabricated by starting as a substrate with a heavily doped *n*-type wafer on one surface of which is grown a more lightly doped *n*-type epitaxial layer. Thereafter ion implantation of a suitable acceptor is used to convert an interior portion of the epitaxial layer to form the lightly doped *p*-type region. Then either ion implantation or vapor diffusion is used to form the more heavily doped *p*-type terminal zone. Localized etching is thereafter used to form a mesa including a portion of the original substrate and the other regions as shown, to reduce the cross section to one appropriate for microwave operation.

In connection with specific oscillator embodiments, there will be described hereafter specific designs of suitable P+PNN+ wafers.

In FIG. 2, there is shown an IMPATT oscillator 20 designed for high frequency operation, typically 50 gHz, utilizing as the active element a P+PNN+ diode essentially of the kind shown in FIG. 1.

In particular, a diode 10 of the kind described is located in a section of rectangular waveguide 21 to serve as a negative resistance diode in the manner characteristic of IMPATT oscillators. Diode 10 is supported on a central portion of one of the broad walls of the guide so that one of its terminal regions makes good electrical and thermal contact therewith. In some instances it may be desirable first to mount the wafer on a conductive heat sink and to use the heat sink as part of the waveguide wall. To provide the other diode terminal, a conductive cap member 23 makes low-resistance pressure contact with the opposite terminal region of the semiconductive element. The cap member is supported in the interior of the guide by a conductive post 24 which extends from the opposite broad wall of the waveguide but is isolated for D-C purposes therefrom by the dielectric bushing 25. This permits the application of the necessary reverse bias to the semiconductive element by connecting a suitable D-C source 22 between post 24 and the waveguide wall. The length along the guide axis of the cap member is adjusted so that there is formed a half-wavelength radial line cavity, with the diode being centrally located therein. The various circuit impedances are adjusted for optimum operation by provision of an adjustable shorting element 26 to terminate one end of the waveguide section and an E-H tuner 27 along the waveguide on the opposite side of the shorting element. Output power is abstracted from the open end 28 of the waveguide. The circuit is tuned to have a resonant frequency which is approximately one half the reciprocal of avalanching carriers across each of the two drift regions.

Figure 4A:
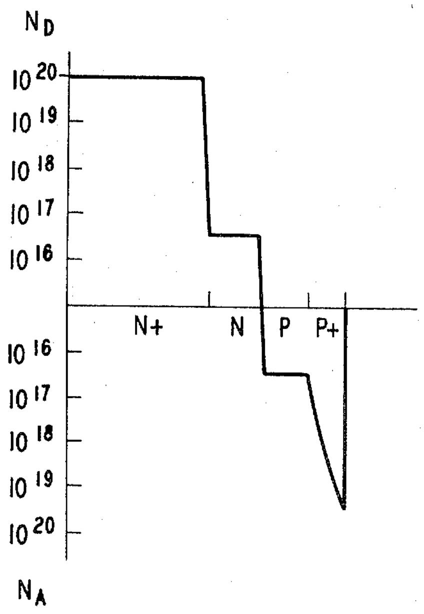
FIG. 4A and 4B show different impurity distributions desired for the diode shown in FIG. 1 for various modes of operation.
Figure 5A:
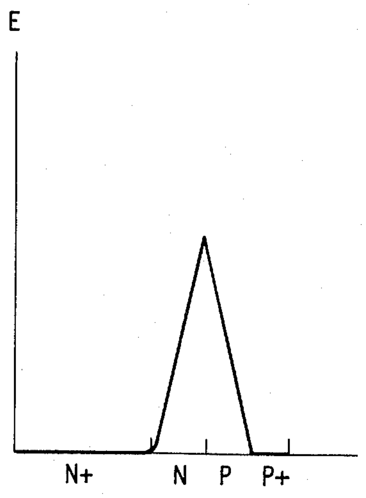
FIGS. 5A and 5B show electric field distributions desired in the diode for various modes of operation.

Upon application of the appropriate reverse bias, the P+PNN+ unit will have a centrally located high field region corresponding to the region of the PN-junction and two drift spaces, one for holes and one for electrons, corresponding essentially to the N and P regions, respectively. For maximum efficiency the doping should result in an electric field profile of the kind shown in FIG. 5A in which the electric field peaks at the PN-junction and drops symmetrically to substantially zero at the two boundaries between the heavily doped and lightly doped regions so that the total width of the space charge layer matches the total width of the two lightly doped regions. To this end, the doping profile of the element is advantageously of the kind shown in FIG. 4A, with relatively equal and uniform doping in each of the two intermediate regions, of the order of magnitude of about $6\times10^{16}$ ions per $cm.^3$ for a particular design to be described below. It is desirable for optimum IMPATT operation that the depletion layer associated with the PN-junction penetrate to the edge of the N—N+ and P—P+ interfaces and the doping and thickness of the weakly doped layers be such that no unswept high-resistivity material remains and punch through to the highly doped terminal regions is avoided.

An element which was operated to provide CW power of 640 milliwatts at 50 gHz in a circuit of the kind described was fabricated essentially as follows. There was formed on an N+ silicon substrate an epitaxial layer about 1.2 microns thick in which the excess donor concentration was approximately $6\times10^{16}/cm.^3$ Multiple boron implantations were done to compensate and counterdope a layer about 0.6 micron thick to provide an excess boron concentration of about $6\times10^{16}/cm.^3$ Thereafter a shallow boron diffusion about 0.15 micron deep was done to form the P+ region and to anneal the implanted boron. The wafer was etched to form a mesa of about 1.5 mils diameter at the PN-junction. The height of the wafer was about 1 mil. The avalanche breakdown voltage of this diode was approximately 26 volts.

In particular for optimum IMPATT operation on the frequency band between 25 gHz and 150 gHz where such devices presently seem most attractive as compared to competing devices, it is important to achieve thicknesses for each of the intermediate layers of between 1.2 microns and 0.2 micron, respectively, and the net doping space charge thickness product in the range of between $2\times10^{12}$ and $6\times10^{12}$ ionized atoms per $cm.^2$. Ion implantation is especially advantageous for fabricating such regions because it permits close control of the number of ionized atoms introduced per $cm.^2$.

A P+PNN+ can be viewed as essentially two complementary avalanche diodes in series. As such, the power output per unit area and impedance on a per unit area basis are both essentially doubled, and accordingly, the power impedance product essentially quadrupled. Moreover, increased efficiency can be expected for at least two reasons. First, the D-C voltage needs to be increased only enough to compensate for the drop in the added or second drift region. Since the voltage drop in the avalanche region and in the drift region are essentially equal for a silicon P or N structure, the total D-C voltage required for the double drift unit is only 50 percent greater than for a single drift region unit. Second, the central location of the avalanche region, away from a heavily doped contact region, greatly reduces minority carrier storage effects and this reduction improves the efficiency of IMPATT operation. Moreover, it is found that the double drift region structure makes for a considerable improvement in small signal negative Q.

The improved IMPATT performance of double-drift region structures also serves to improve TRAPATT mode operation since it is now known that the TRAPATT mode requires a large-signal IMPATT oscillation to be present. In particular, to obtain self-starting TRAPATT oscillations large IMPATT generated voltage swings must be achieved by trapping IMPATT oscillations in a high Q cavity.

FIG. 3 shows the basic circuit of a TRAPATT oscillator 30 which can utilize the P+PNN+ diode of the kind described. The circuit comprises a section of coaxial transmission line 31 which is terminated by the shorting member 32 at one end and which includes a diode 10 inserted serially in the central conductor 33 of the coaxial at such end, one terminal zone of the diode contacting the center of the shorting member and the other terminal zone of the diode contacting the end of the central conductor. Conductive radial disc member 34 extends from the central conductor at the point of connection of the diode and serves to resonate the diode at the operating frequency corresponding to the IMPATT mode. Provision is made for applying the desired DC voltage bias to the diode by way of the closed end of the line. Member 34 also serves to provide a lumped capacitance useful for providing the extra charge required for the high-current state characteristic of the TRAPATT mode. Additionally, a low-pass filter 35 is disposed along the line spaced from the diode by a distance corresponding to one half the wavelength of the TRAPATT frequency desired to be abstracted as an output, which is a subharmonic of the IMPATT mode frequency, for example, the tenth corresponding to 5 gHz for an IMPATT frequency of 50 gHz. The filter can be formed in known fashion by a series of spaced coaxial conductive sleeves partially filling the space between the inner and outer conductors of the coaxial line. The function of the filter is to pass the TRAPATT frequency while providing a shorting plane for the harmonics of that frequency. On the load side of the filter, there typically would be included a provision for tuning the TRAPATT frequency.

The low-pass filter 35 provides a high-frequency short circuit for a triggering pulse required to sustain the TRAPATT mode of operation. This triggering pulse is generated by the rapid drop in voltage as the plasma state is created in the diode. This drop in diode voltage, from approximately the breakdown value to zero, propagates down the transmission line and is reflected by the high-frequency short with a reflection coefficient of approximately −1. Thus, a positive pulse voltage is reflected back toward the diode with an amplitude on the order of twice the breakdown voltage. Thus the maximum "overvoltage" which can be developed by the circuit is about twice the breakdown voltage, which is normally adequate to lead to TRAPATT operation at the low range of microwave frequencies.

However, as the design frequency of the IMPATT diode is increased, the required overvoltage for TRAPATT operation goes above twice the breakdown voltage and the conventional diode and circuit is no longer capable of sustaining TRAPATT operation. This problem can be solved by using a diode which punches through well before breakdown, such as a diode which is more nearly like a PIN diode having a relatively wide region of low doping between two terminal zones. This has the drawback that the negative resistance at the IMPATT frequency for a given current is decreased. Accordingly, as the operating frequency is increased the requirements for TRAPATT optimization (low overvoltage) and IMPATT optimization (maximum negative conductance at a given bias current) diverge.

Figure 5B:
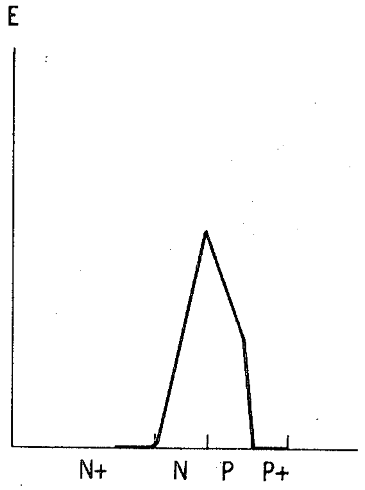

We have resolved this dilemma with a P+PNN+ diode in which the P+P section is optimized for IMPATT operation, being just punched through at breakdown, whereas the N+N section is arranged to punch through well before breakdown and requires an overvoltage of less than twice the breakdown for efficient TRAPATT operation. An electric field distribution which satisfies this prescription is shown in FIG. 5B.

Figure 4B:
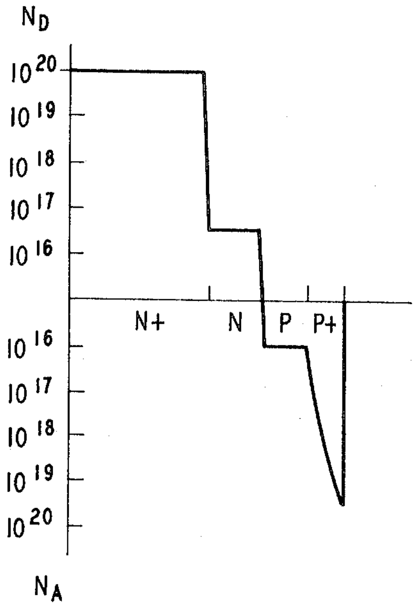

A suitable diode structure has been fabricated using ion-implantation techniques. There was first grown on a monocrystalline $n+$-type silicon substrate a 1.2 microns thick epitaxial $n$-type layer doped with $5\times10^{16}$ donors/cm.$^3$. Boron implantation to a depth of 0.6 micron was used to compensate the layer and to form a $p$-type region with an excess acceptor concentration of about $1\times10^{16}$/cm.$^3$. A region about 0.1 micron thick which was $p+$-type was formed by diffusion. In FIG. 4B there is depicted a typical doping profile. Localized etching was used to form a mesa of about 1.5 mils diameter. This structure has a breakdown voltage of about 27 volts. In the TRAPATT section, the net doping-space charge thickness product is about one fifth that in the IMPATT section.

The IMPATT frequency for this diode is approximately 50 gHz and continuous wave TRAPATT operation at 10 percent efficiency has been readily obtained form 4 to 6 gHz even in a circuit which had not been maximized for efficiency.

At lower frequencies, it may be less advantageous to employ an asymmetric diode structure and in some instances even preferable to employ a symmetric diode. For example, it is feasible to employ a symmetric diode in which each side punches through at about one half the breakdown voltage. The individual sides will have a larger than optimum IMPATT negative Q but the two sides in series will have a small enough negative Q to start the TRAPATT oscillator.

It is to be understood that the specific embodiments described are merely illustrative of the general principles of the invention. Various modifications are possible without departing from the spirit and scope of the invention. For example, the diode may be of germanium or gallium arsenide or any other suitable semiconductor. The circuit may take a wide variety of forms especially with respect to the manner in which the desired resonances are achieved. Provision can be made for cooling the diode, such as the use of special heat sinks or coolants. The diode wafer can be made ultrathin particularly with respect to the heavily doped terminal layers whose terminal layers advantageously are made as thin as practical.

A general discussion of IMPATT and TRAPATT devices can be found in a paper entitled "Avalanche and Gunn Effect Microwave Oscillators" in *Solid State Technology*, Feb. 1970, pp. 37–48.

In particular, it appears that operation of the kind which has been described herein as the TRAPATT mode is sometimes described in the literature as the anomalous or high-efficiency avalanche mode.

Moreover, it is within the spirit of the present invention to drive oscillators of the kind described with a weak external frequency modulated signal whereby there is derived as an output an amplified version of the driving signal. An amplifier of this kind is described in a paper entitled "A New Microwave Amplifier for Multichannel FM Signals Using a Synchronized Oscillator" in the Dec. 1969 issue of the *IEE Journal of Solid State Circuits*, pp. 400–408. This simply requires provision for the introduction of the signal to be amplified into the resonant structure by adding a port through which the signal can be introduced.

What is claimed is:

1. A microwave oscillator comprising
   a semiconductive diode having a P+PNN+ doping profile
   biasing means for said diode whereby there is created therein an avalanche region centrally located between a pair of drift regions, and
   resonant means coupled to the diode having a resonant frequency which is approximately one half the reciprocal of the transit time of avalanching carriers across each of the two drift regions.

2. A microwave oscillator in accordance with claim 1 which further includes a structure resonant at a subharmonic of said first-mentioned resonant frequency and provision for abstracting power from the source selectively at said subharmonic while containing within the source power at the resonant frequency.

3. A microwave oscillator comprising
   a section of coaxial transmission line,
   a P+PNN+ semiconductive diode mounted serially in the inner conductor of the line at one end of the line,
   means located adjacent the diode along the line providing a lumped capacitance for forming a resonant circuit with the diode at a microwave frequency, and
   means spaced along the line away from the diode for forming a low-pass filter reflecting power at said microwave frequency but passing power at a desired subharmonic of said microwave frequency, the spacing of this means from the diode corresponding to one half the wavelength of the desired subharmonic.

4. A microwave oscillator in accordance with claim 3 in which the diode is asymmetric having one intermediate region of lower doping than the other intermediate region of opposite conductivity type.

5. A microwave oscillator in accordance with claim 4 in which the doping and thickness of each of the two intermediate zones of the diode are such that at the avalanche breakdown the electric field falls substantially to zero at each of the two interfaces between zones of relatively high resistivity and relatively low resistivity.

6. A microwave oscillator in accordance with claim 4 in which the doping and thickness of each of the two intermediate zones of the diode are such that at avalanche breakdown the electric field falls substantially to zero at one of the two interfaces between zones of relatively high resistivity and relatively low resistivity and still has a substantial value at the other interface.

7. A microwave oscillator in accordance with claim 5 for operation in the range between 25 gHz and 150 gHz in which the net doping-space charge thickness product is in the range between $2\times10^{12}$ and $6\times10^{12}$ and the intermediate zones have a thickness between 1.2 microns and 0.2 micron.

8. A microwave oscillator in accordance with claim 6 in which the net doping-space charge width product for one intermediate zone of the diode is about one fifth that for the other intermediate zone.

9. A microwave oscillator which employs a semiconductive diode as a negative resistance characterized by the improvement that the diode comprises in succession first and second regions of one conductivity type and relatively low and relatively high resistivities, respectively, and third and fourth regions of the opposite conductivity type and relatively high and low resistivities, respectively, and in that the diode is included in a resonant structure and is designed to operate in a trapped plasma avalanche triggered transit mode.

10. A microwave oscillator in accordance with claim 9 further characterized in that the diode is included in a resonant structure and is asymmetric for operation in part in an impact avalanche transit time mode and in part in a trapped plasma triggered transit mode.

11. A microwave oscillator for operation in the 25 gHz to 150 gHz range which employs a semiconductive diode as a negative resistance characterized by the improvement that the diode comprises in succession first and second regions of one conductivity type and relatively low and relatively high resistivities, respectively, and third and fourth regions of the opposite conductivity type and relatively high and low resistivities, respectively, and in that the diode is included in a structure resonant in said operating frequency range and is designed to operate in an impact ionization avalanche transit time mode in said frequency range.

* * * * *